United States Patent
Niu et al.

(10) Patent No.: US 10,600,727 B2
(45) Date of Patent: *Mar. 24, 2020

(54) MOLDED INTELLIGENT POWER MODULE FOR MOTORS

(71) Applicant: Alpha and Omega Semiconductor (Cayman) Ltd., Grand Cayman (KY)

(72) Inventors: Zhiqiang Niu, Santa Clara, CA (US); Bum-Seok Suh, Seongnam (KR); Jun Lu, San Jose, CA (US); Son Tran, San Jose, CA (US); Wanki Hong, Bucheon-si (KR); Guobing Shen, Shanghai (CN); Xiaoguang Zeng, Shanghai (CN); Mary Jane R. Alin, Shanghai (CN)

(73) Assignee: ALPHA AND OMEGA SEMICONDUCTOR (CAYMAN) LTD., Grand Cayman (KY)

(*) Notice: Subject to any disclaimer, the term of this patent is extended or adjusted under 35 U.S.C. 154(b) by 0 days.

This patent is subject to a terminal disclaimer.

(21) Appl. No.: 16/122,690

(22) Filed: Sep. 5, 2018

(65) Prior Publication Data

US 2019/0006270 A1   Jan. 3, 2019

Related U.S. Application Data

(63) Continuation-in-part of application No. 15/699,985, filed on Sep. 8, 2017, now Pat. No. 10,141,249, which
(Continued)

(51) Int. Cl.
H01L 23/495   (2006.01)
H01L 27/06    (2006.01)
(Continued)

(52) U.S. Cl.
CPC .. *H01L 23/49575* (2013.01); *H01L 23/49531* (2013.01); *H01L 23/49562* (2013.01);
(Continued)

(58) Field of Classification Search
CPC ....... H01L 2924/00; H01L 2924/00014; H01L 2224/48227; H01L 2224/73265;
(Continued)

(56) References Cited

U.S. PATENT DOCUMENTS

| D505,400 S | 5/2005 | Kawafuji et al. |
| 2008/0230889 A1* | 9/2008 | Standing ............... H01L 23/492 257/693 |

* cited by examiner

*Primary Examiner* — Robert G Bachner
(74) *Attorney, Agent, or Firm* — Chen-Chi Lin (57) ABSTRACT

An intelligent power module (IPM) has a first, second, third and fourth die supporting elements, a first, second, third, fourth, fifth and sixth transistors, a connection member, a low voltage IC, a high voltage IC, a plurality of leads and a molding encapsulation. The first transistor is attached to the first die supporting element. The second transistor is attached to the second die supporting element. The third transistor is attached to the third die supporting element. The fourth, fifth and sixth transistor s are attached to the fourth die supporting element. The low and high voltage ICs are attached to the connection member. The molding encapsulation encloses the first, second, third and fourth die supporting elements, the first, second, third, fourth, fifth and sixth transistors, the connection member and the low and high voltage ICs. The IPM has a reduced thermal resistance of junction-to-case ($R_{th}JC$) compared to a conventional IPM.

20 Claims, 6 Drawing Sheets

Related U.S. Application Data is a continuation-in-part of application No. 15/600,698, filed on May 19, 2017, now Pat. No. 9,881,856, which is a continuation of application No. 15/294,766, filed on Oct. 16, 2016, now Pat. No. 9,704,789, said application No. 15/699,985 is a continuation-in-part of application No. 15/602,002, filed on May 22, 2017, now Pat. No. 10,177,080, which is a continuation-in-part of application No. 15/294,766, filed on Oct. 16, 2016, now Pat. No. 9,704,789.

(51) Int. Cl.
*H01L 23/00* (2006.01)
*H01L 23/31* (2006.01)

(52) U.S. Cl.
CPC .......... *H01L 24/49* (2013.01); *H01L 27/0629* (2013.01); *H01L 23/3107* (2013.01); *H01L 24/32* (2013.01); *H01L 24/48* (2013.01); *H01L 24/73* (2013.01); *H01L 2224/04042* (2013.01); *H01L 2224/32245* (2013.01); *H01L 2224/48139* (2013.01); *H01L 2224/48247* (2013.01); *H01L 2224/4903* (2013.01); *H01L 2224/49111* (2013.01); *H01L 2224/73265* (2013.01); *H01L 2924/00012* (2013.01); *H01L 2924/00014* (2013.01); *H01L 2924/13055* (2013.01); *H01L 2924/13091* (2013.01); *H01L 2924/1815* (2013.01); *H01L 2924/3511* (2013.01)

(58) Field of Classification Search
CPC . H01L 2924/00012; H01L 2224/32225; H01L 2224/48247; H01L 2924/181; H01L 2224/48465; H01L 2924/0002; H01L 2224/45099; H01L 2924/15311; H01L 2224/49171; H01L 2924/14; H01L 2224/49175; H01L 2924/1305; H01L 2924/01029; H01L 2924/30107; H01L 2224/45144; H01L 2924/014; H01L 2224/05599; H01L 2224/45015; H01L 2224/48472; H01L 2924/13091; H01L 2924/1306; H01L 2924/01033; H01L 2224/32245; H01L 2224/49111; H01L 2924/01082; H01L 2924/01047; H01L 2924/19041; H01L 2924/19107; H01L 2924/01074; H01L 2224/0401; H01L 2224/48095; H02M 7/003; H02M 7/537; H05K 7/20927; H05K 7/1432; H05K 7/2089; H05K 1/0262; H05K 1/0263; H05K 1/144; H05K 2201/2009; H05K 13/00; H05K 1/0222; H05K 1/023; H05K 1/0231; H05K 1/0251; H05K 1/0271; H05K 1/0306; H05K 1/09; H05K 1/113; H05K 1/115; H05K 1/141; H05K 1/145; H05K 1/162; H05K 1/18; H05K 1/181; H05K 1/183; H05K 1/185; H05K 2201/0175; H05K 2201/0355; H05K 2201/068; H05K 2201/09036; H05K 2201/09136; H05K 2201/09518; H05K 2201/096; H05K 2201/09636; H05K 2201/09718; H05K 2201/10159; H05K 2201/10166; H05K 2201/10242; H05K 2201/1031; H05K 2201/10409; H05K 2201/10424; H05K 2201/10522; H05K 2201/1059; H05K 2201/10659; H05K 2201/10962; H05K 2201/2018; H05K 2203/0152; H05K 2203/0405; H05K 2203/1178; H05K 3/0052; H05K 3/0061; H05K 3/202; H05K 3/284; H05K 3/305; H05K 3/325; H05K 3/3421; H05K 3/3452; H05K 3/368; H05K 3/38; H05K 3/4015; H05K 3/429; H05K 3/4644; H05K 3/4652; H05K 5/0247; H05K 7/1412; H05K 7/20845; H01F 27/2804; H01F 2027/2809; G06F 1/26; G06F 17/5045; G06F 17/5054; G06F 17/5068; G06F 17/5077; G06F 1/3203; G06F 1/324; G06F 2217/12; G06F 2217/62; H01G 4/232; H01G 4/30; H01G 4/33; H01G 4/40; B23K 1/0008; B23K 2201/40; B23K 3/0623; B81C 1/0023; F28F 3/12; G01L 19/0076; G01L 9/0044; G06K 19/072; G06K 19/077; G06K 19/07769; H01R 13/2421; Y02P 70/611; Y02P 70/613; Y02P 90/265; Y10T 29/41; Y10T 29/49082; Y10T 29/49169; Y10T 307/50

See application file for complete search history.

MOLDED INTELLIGENT POWER MODULE FOR MOTORS

CROSS-REFERENCE TO RELATED APPLICATIONS

This patent application is a Continuation-in-part application of a pending patent application Ser. No. 15/699,985 filed on Sep. 8, 2017. Patent application Ser. No. 15/699,985 is a Continuation-in-part application of a pending patent application Ser. No. 15/600,698 filed on May 19, 2017 and issued as U.S. Pat. No. 9,881,856 on Jan. 30, 2018. Patent application Ser. No. 15/600,698 is a Continuation of a patent application Ser. No. 15/294,766 filed on Oct. 16, 2016 and issued as U.S. Pat. No. 9,704,789 on Jul. 11, 2017. Patent application Ser. No. 15/699,985 is a Continuation-in-part application of a pending patent application Ser. No. 15/602,002 filed on May 22, 2017. Patent application Ser. No. 15/602,002 is a Continuation-in-part application of the patent application Ser. No. 15/294,766 filed on Oct. 16, 2016 and issued as U.S. Pat. No. 9,704,789 on Jul. 11, 2017. The disclosure made in the patent application Ser. No. 15/699,985, the disclosure made in patent application Ser. No. 15/294,766, the disclosure made in patent application Ser. No. 15/600,698 and the disclosure made in patent application Ser. No. 15/602,002 are hereby incorporated by reference.

FIELD OF THE INVENTION

This invention relates generally to a molded intelligent power module (IPM) for driving a motor. More particularly, the present invention relates to a molded IPM having a reduced thermal resistance of junction-to-case ($R_{th}JC$) compared to a conventional IPM.

BACKGROUND OF THE INVENTION

A conventional IPM uses an insulated metal substrate (IMS). The IMS is usually clamped by two copper layers. In the present disclosure, the use of lead frame and die supporting elements in an over-mold type IPM simplifies the manufacturing process and reduces fabrication cost. The die supporting elements may be of a die attach pad (DAP) type or a direct bonded copper (DBC) type. A conventional IPM for driving a motor has three driving integrated circuits (ICs). In the present disclosure, the IPM has a low voltage IC and a high voltage IC.

Compact package size is achieved by optimization of the layout. The optimization includes use of two driving ICs instead of three driving ICS and introduction of conformal curved sides along adjacent die supporting elements. Reduction of the number of leads is achieved by attaching the two driving ICs on a same connection member.

SUMMARY OF THE INVENTION

The present invention discloses an IPM having a first, second, third and fourth die supporting elements, a first, second, third, fourth, fifth and sixth metal-oxide-semiconductor field-effect transistors (MOSFETs), a connection member, a low voltage IC, a high voltage IC, a plurality of leads and a molding encapsulation. The first MOSFET is attached to the first die supporting element. The second MOSFET is attached to the second die supporting element. The third MOSFET is attached to the third die supporting element. The fourth, fifth and sixth MOSFETs are attached to the fourth die supporting element. The low and high voltage ICs are attached to the connection member. The molding encapsulation encloses the first, second, third and fourth die supporting elements, the first, second, third, fourth, fifth and sixth MOSFETs, the connection member and the low and high voltage ICs.

In examples of the present disclosure, the reduction of $R_{th}JC$ of the present disclosure enables the IPM to be used for heavy load motors having current larger than ten amperes. In examples of the present disclosure, the IPM is 33.4 mm in length and 15.0 mm in width.

BRIEF DESCRIPTION OF THE DRAWINGS

FIG. 1A is a top view.

FIG. 2A is a top view.

FIG. 3A is a top view.

DETAILED DESCRIPTION OF THE INVENTION

Figure 1A:
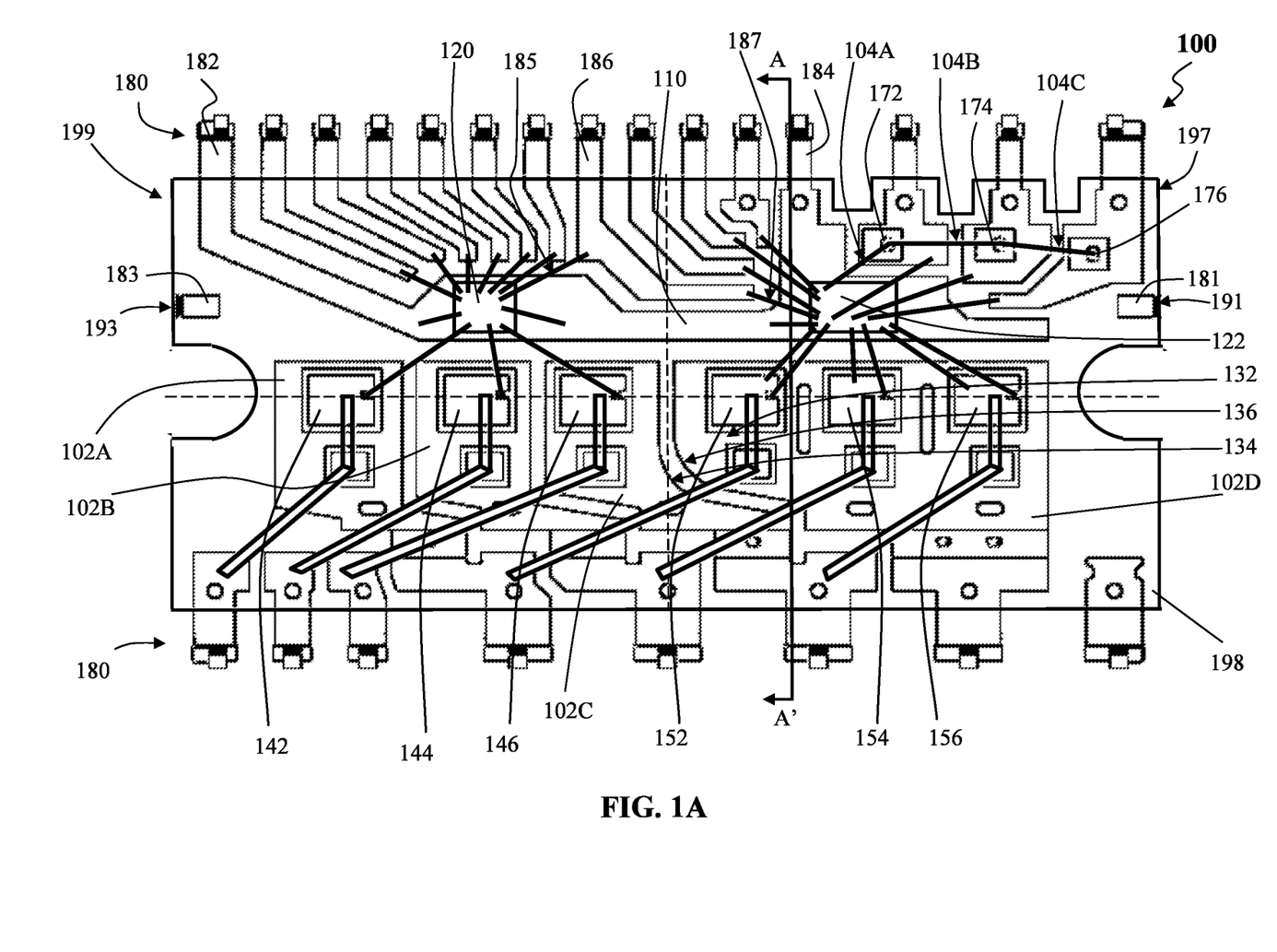
Figure 1B:
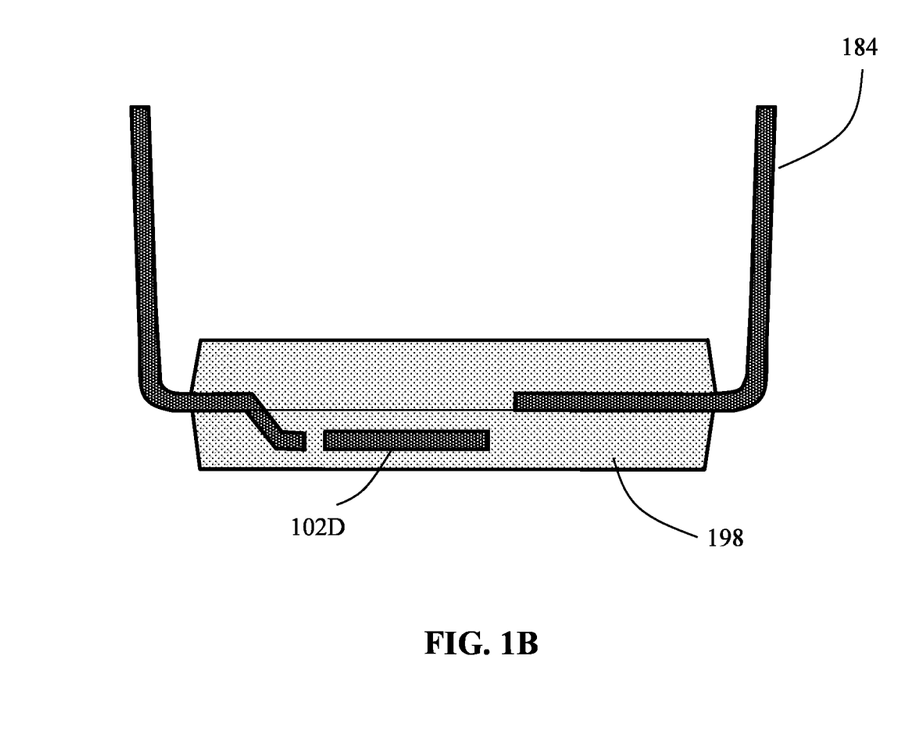
FIG. 1B is a cross-sectional view perpendicular to AA plane of an IPM in examples of the present disclosure.

FIG. 1A is a top view, FIG. 1B is a cross-sectional view perpendicular to AA plane of an IPM 100 in examples of the present disclosure. The IPM 100 has a first die supporting element 102A, a second die supporting element 102B, a third die supporting element 102C, a fourth die supporting element 102D, a first transistor 142, a second transistor 144, a third transistor 146, a fourth transistor 152, a fifth transistor 154, a sixth transistor 156, a connection member 110, a low voltage IC 120, a high voltage IC 122, a first boost diode 172, a second boost diode 174, a third boost diode 176, a plurality of leads 180, a first dummy bar 181, a second dummy bar, and a molding encapsulation 198.

The first die supporting element 102A, the second die supporting element 102B, the third die supporting element 102C, and the fourth die supporting element 102D are separated from each other and arranged one by one next each other in sequence with one edge of each die supporting element aligned substantially in a line. A majority of the connection member 110 extends along the aligned edges of the die supporting elements. The first transistor 142 is attached to the first die supporting element 102A. The second transistor 144 is attached to the second die supporting element 102B. The third transistor 146 is attached to the third die supporting element 102C. The fourth transistor 152, the fifth transistor 154 and the sixth transistor 156 are attached to the fourth die supporting element 102D.

In examples of the present disclosure, the molding encapsulation 198 encloses the first die supporting element 102A, the second die supporting element 102B, the third die supporting element 102C, the fourth die supporting element 102D, the first transistor 142, the second transistor 144, the third transistor 146, the fourth transistor 152, the fifth transistor 154, the sixth transistor 156, the connection member 110, the low voltage IC 120, the high voltage IC 122, the first boost diode 172, the second boost diode 174 and the third boost diode 176. In examples of the present disclosure, the plurality of leads 180 are partially embedded in the molding encapsulation 198 extruding from opposite side surfaces of the molding encapsulation 198. In examples of the present disclosure, the molding encapsulation 198 encloses a majority portion of the first dummy bar 181 and a majority portion of the second dummy bar 183. A first end surface 191 of the first dummy bar 181 is exposed from a first end surface 197 of the molding encapsulation 198. A second end surface 193 of the second dummy bar 183 is exposed from a second end surface 199 of the molding encapsulation 198. The second end surface 199 of the molding encapsulation 198 is opposite to the first end surface 197 of the molding encapsulation 198. End surfaces 197 and 199 are substantially perpendicular to the opposite side surfaces of the molding encapsulation 198 from which the leads extend. In examples of the present disclosure, the first dummy bar 181 and the second dummy bar 183 facilitate handling of the IPM 100 during a manufacturing process. Before a singulation process, the first dummy bar 181 connects to an adjacent dummy bar of an adjacent IPM and the second dummy bar 183 connects to another adjacent dummy bar of another adjacent IPM.

In examples of the present disclosure, the first dummy bar 181 is electrically isolated from the second dummy bar 183. The first dummy bar 181 and the second dummy bar 183 are electrically floating that they are both isolated from the connection member 110 and the first die supporting element 102A, the second die supporting element 102B, the third die supporting element 102C, and the fourth die supporting element 102D. Therefore, the low voltage IC 120 and the high voltage IC 122 will not be damaged even a heat sink improperly contacts the first end surface 191 of the first dummy bar 181 or the second end surface 193 of the second dummy bar 183.

The plurality of leads 180 comprises a first ground lead 182, a second ground lead 184 and a power supply lead 186. In examples of the present disclosure, the IPM 100 does not include another power supply lead other than the power supply lead 186. Therefore, the power supply lead 186 is a single power supply lead. The connection member 110 electrically and mechanically connects to the first ground lead 182 and the second ground lead 184. The low voltage IC 120 electrically connects to the power supply lead 186 by a first bonding wire 185. The high voltage IC 122 electrically connects to the power supply lead 186 by a second bonding wire 187.

In examples of the present disclosure, the first die supporting element 102A is a first die attach pad (DAP). The second die supporting element 102B is a second DAP. The third die supporting element 102C is a third DAP. The fourth die supporting element 102D is a fourth DAP.

In examples of the present disclosure, a first bonding wire 104A connects the first boost diode 172 to the high voltage IC 122. A second bonding wire 104B connects the second boost diode 174 to the first boost diode 172. A third bonding wire 104C connects the third boost diode 176 to the second boost diode 174.

In examples of the present disclosure, a first curved side 134 of the third die supporting element 102C and a second curved side 136 of the fourth die supporting element 102D have a same center of curvature 132. A radius of curvature of the first curved side 134 is larger than a radius of curvature of the second curved side 136.

In examples of the present disclosure, the low voltage IC 120 and the high voltage IC 122 are directly attached to the connection member 110. The IPM 100 excludes another IC directly attached to the connection member 110.

Figure 2A:
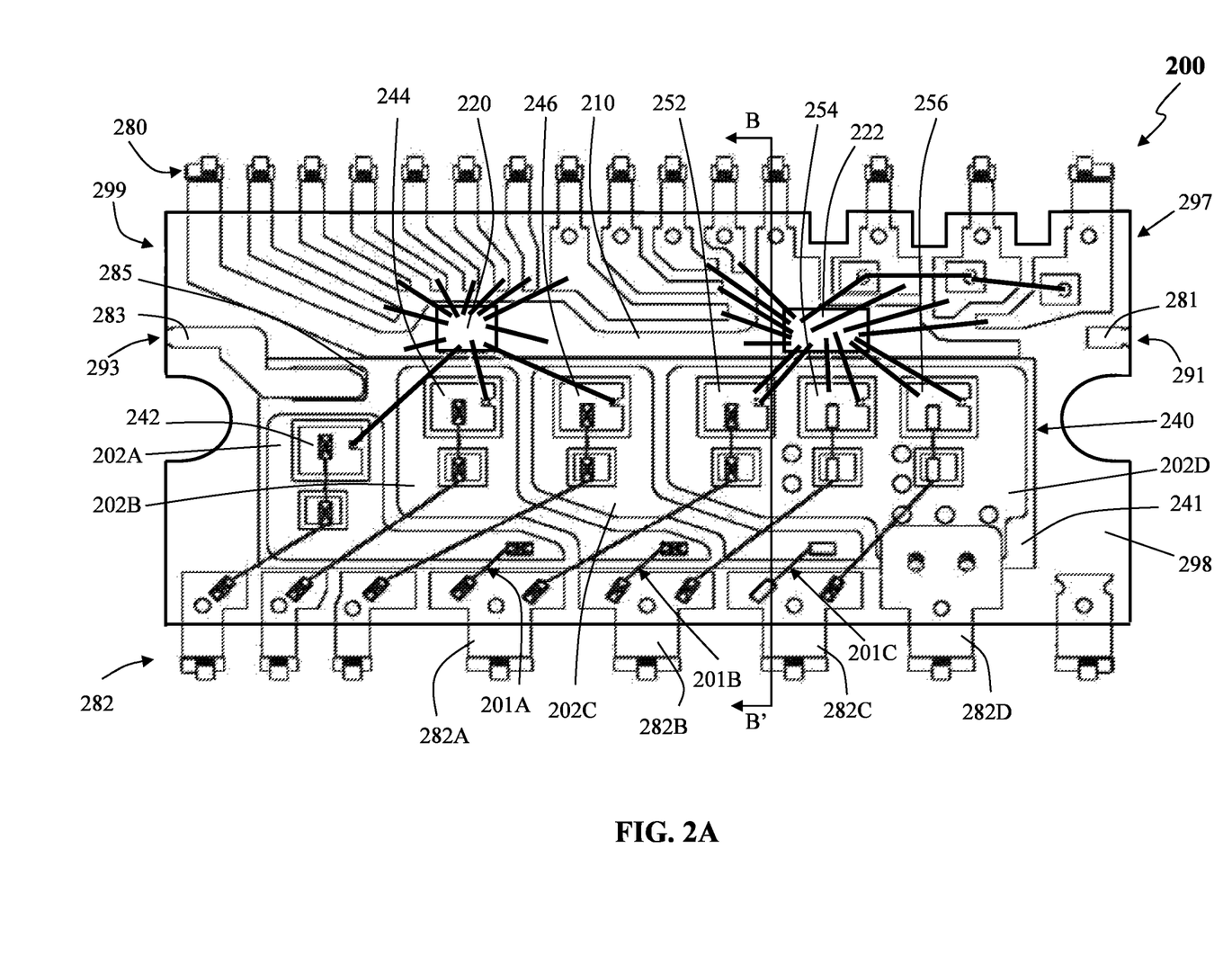
Figure 2B:
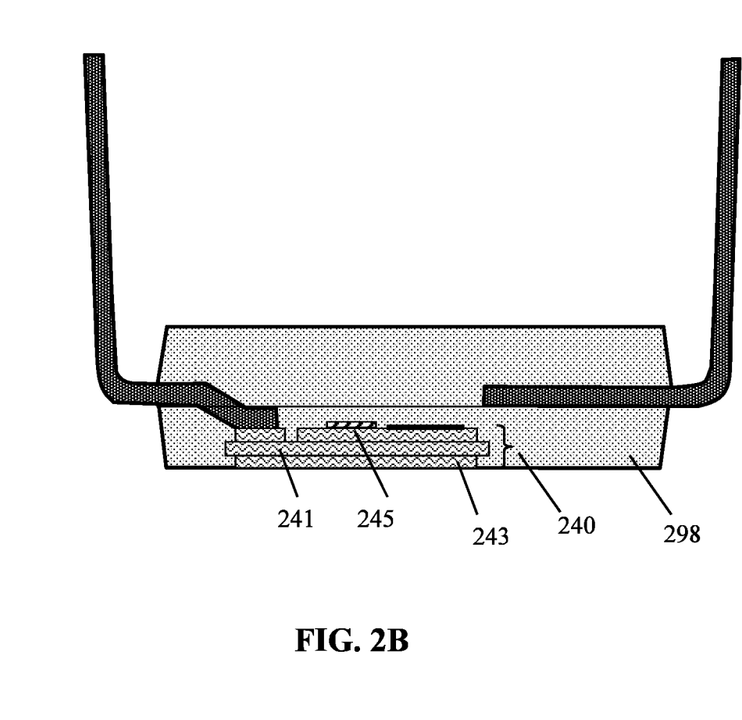
FIG. 2B is a cross-sectional view perpendicular to BB plane of another IPM in examples of the present disclosure.

FIG. 2A is a top view, FIG. 2B is a cross-sectional view perpendicular to BB plane of an IPM 200 in examples of the present disclosure. The IPM 200 has a first die supporting element 202A, a second die supporting element 202B, a third die supporting element 202C, a fourth die supporting element 202D, a first transistor 242, a second transistor 244, a third transistor 246, a fourth transistor 252, a fifth transistor 254, a sixth transistor 256, a connection member 210, a low voltage IC 220, a high voltage IC 222, a plurality of leads 280 and 282, a dummy bar 281, a connection bar 283, and a molding encapsulation 298.

The first die supporting element 202A, the second die supporting element 202B, the third die supporting element 202C, and the fourth die supporting element 202D are separated from each other and arranged one by one next each other in sequence with one edge of each die supporting element aligned substantially in a line. A majority of the connection member 210 extends along the aligned edges of the die supporting elements. The first transistor 242 is attached to the first die supporting element 202A. The second transistor 244 is attached to the second die supporting element 202B. The third transistor 246 is attached to the third die supporting element 202C. The fourth transistor 252, the fifth transistor 254 and the sixth transistor 256 are attached to the fourth die supporting element 202D.

In examples of the present disclosure, the molding encapsulation 298 encloses the first die supporting element 202A, the second die supporting element 202B, the third die supporting element 202C, the fourth die supporting element 202D, the first transistor 242, the second transistor 244, the third transistor 246, the fourth transistor 252, the fifth transistor 254, the sixth transistor 256, the connection member 210, the low voltage IC 220 and the high voltage IC 222.

In examples of the present disclosure, the plurality of leads 280 and 282 are partially embedded in the molding encapsulation 298. In examples of the present disclosure, the molding encapsulation 298 encloses a majority portion of the dummy bar 281 and a majority portion of the connection bar 283. An end surface 291 of the dummy bar 281 is exposed from a first end surface 297 of the molding encapsulation 298. An end surface 293 of the connection bar 283 is exposed from a second end surface 299 of the molding encapsulation 298. The second end surface 299 of the molding encapsulation 298 is opposite to the first end surface 297 of the molding encapsulation 298. In examples of the present disclosure, the dummy bar 281 and the connection bar 283 facilitate handling of the IPM 200 during a manufacturing process. Before a singulation process, the dummy bar 281 connects to an adjacent connection bar of an adjacent IPM and the connection bar 283 connects to an adjacent dummy bar of another adjacent IPM.

In examples of the present disclosure, the dummy bar 281 is electrically isolated from the connection bar 283. The connection bar 283 is electrically and mechanically connected to a connection pad 285, preferably by a solder paste. The dummy bar 281, the connection bar 283 and the connection pad 285 are electrically floating that they are isolated from the connection member 210 and the first die supporting element 202A, the second die supporting element 202B, the third die supporting element 202C, and the fourth die supporting element 202D. Therefore, the low voltage IC 220 and the high voltage IC 222 will not be damaged even a heat sink improperly contacts the end surface 291 of the dummy bar 281 or the end surface 293 of the connection bar 283.

In examples of the present disclosure, the first die supporting element 202A, the second die supporting element 202B, the third die supporting element 202C, and the fourth die supporting element 202D are metal (Cu) pads patterned on a direct bonded copper (DBC) type substrate 240. One advantage of DBC type substrate 240 is to reduce thermal resistance of junction-to-case ($R_{th}JC$). The DBC type substrate 240 comprises a bottom copper layer 243, a middle insulation layer 241 and a top copper layer 245. The top copper layer 245 of the DBC type substrate 240 comprises the connection pad 285, a first pad of the first die supporting element 202A, a second pad of the second die supporting element 202B, a third pad of the third die supporting element 202C and a fourth pad of the fourth die supporting element 202D.

In examples of the present disclosure, the DBC type substrate 240 in the embodiment shown is substantially rectangular in shape. The connection member 210 is adjacent and separate from a first long edge of the DBC type substrate 240. The plurality of leads 280 are disposed on a first side of the IPM 200 adjacent to the connection member 210 and away from the DBC type substrate 240, the plurality of leads 282 disposed on a second side of the IPM 200 adjacent to the DBC type substrate 240, opposite the first side of the IPM 200. The connection member 210 and the pluralities of leads 280 and 282, as well as the dummy bar 281 and the connection bar 283, are made from regular lead frame material such as a single gauge or dual gauge copper and copper alloy, or other metal composition. As shown in FIG. 2A, the first die supporting element 202A is disposed at a first end of the DBC type substrate 240 and the fourth die supporting element 202D is disposed at a second end of the die supporting element 202 opposite the first end. The connection pad 285 is disposed on the first end of the DBC type substrate 240 at a first corner close to the connection bar 283, separating the first die supporting element 202A from the first long edge of the DBC type substrate 240. As shown, the first die supporting element 202A is electrically connected to a first phase lead 282A of the plurality of leads 282 by a first bonding wire 201A. The second die supporting element 202B is electrically connected to a second phase lead 282B of the plurality of leads 282 by a second bonding wire 201B. The third die supporting element 202C is electrically connected to a third phase lead 282C of the plurality of leads 282 by a third bonding wire 201C. The fourth die supporting element 202D is electrically and mechanically connected to an input lead 282D of the plurality of leads 282 with the input lead 282D directly soldered to an edge portion of the fourth die supporting element 202D, approximating a second corner on the DBC type substrate 240 diagonally opposite the first corner. The mechanical connections between the connection bar 283 and the connection pad 285 at the first corner of the DBC type substrate 240, and between the input lead 282D and the fourth die supporting element 202D at the second long edge near the second corner of the DBC type substrate 240, anchor the position of the DBC type substrate 240 surrounded by the connection member 210 and the pluralities of leads 280 and 282, thus providing a lead frame.

In examples of the present disclosure, the first transistor 242 is a first metal-oxide-semiconductor field-effect transistor (MOSFET). The second transistor 244 is a second MOSFET. The third transistor 246 is a third MOSFET. The fourth transistor 252 is a fourth MOSFET. The fifth transistor 254 is a fifth MOSFET. The sixth transistor 256 is a sixth MOSFET.

In examples of the present disclosure, the first transistor 242 is a first insulated gate bipolar transistor (IGBT). The second transistor 244 is a second IGBT. The third transistor 246 is a third IGBT. The fourth transistor 252 is a fourth IGBT. The fifth transistor 254 is a fifth IGBT. The sixth transistor 256 is a sixth IGBT.

Figure 3A:
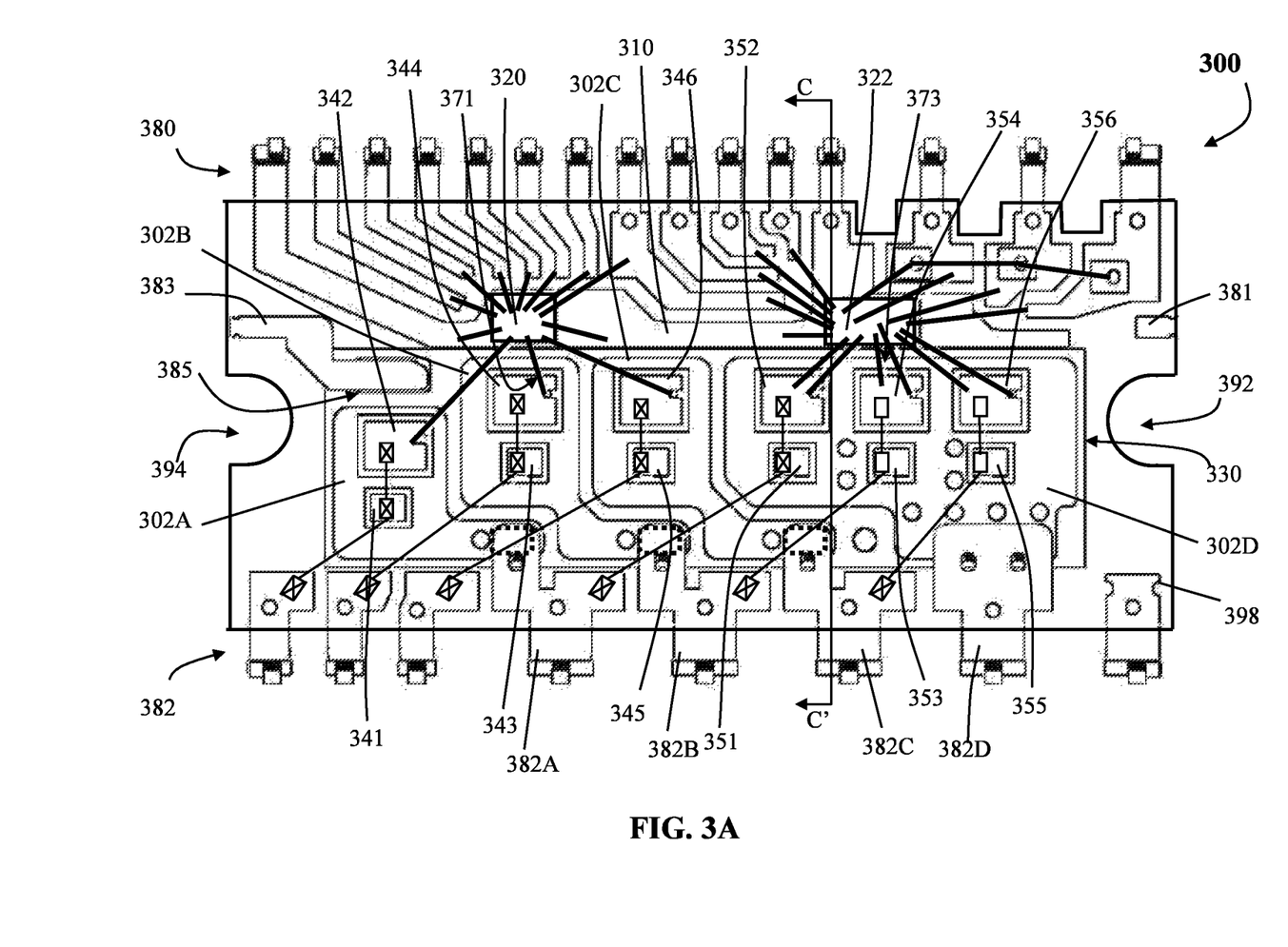
Figure 3B:
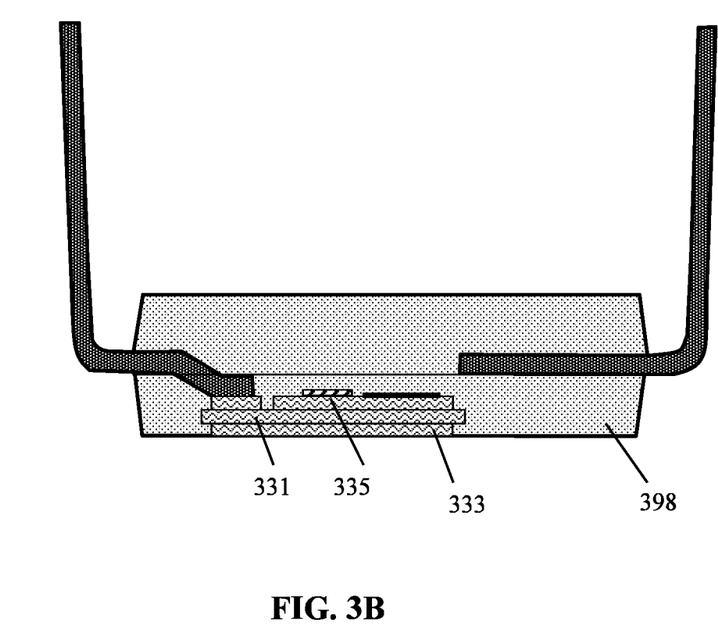
FIG. 3B is a cross-sectional view perpendicular to CC plane of still another IPM in examples of the present disclosure.

FIG. 3A is a top view, FIG. 3B is a cross-sectional view perpendicular to CC plane of an IPM 300 in examples of the present disclosure. The IPM 300 has a first die supporting element 302A, a second die supporting element 302B, a third die supporting element 302C, a fourth die supporting element 302D, a first transistor 342, a second transistor 344, a third transistor 346, a fourth transistor 352, a fifth transistor 354, a sixth transistor 356, a connection member 310, a low voltage IC 320, a high voltage IC 322, a plurality of leads 380 and 382, a dummy bar 381, a connection bar 383, a first fast recovery diode (FRD) 341, a second FRD 343, a third FRD 345, a fourth FRD 351, a fifth FRD 353, and a sixth FRD 355 and a molding encapsulation 398.

The first die supporting element 302A, the second die supporting element 302B, the third die supporting element 302C, and the fourth die supporting element 302D are separated from each other and arranged one by one next each other in sequence with one edge of each die supporting element aligned substantially in a line. A majority of the connection member 310 extends along the aligned edges of the die supporting elements. The first transistor 342 is attached to the first die supporting element 302A. The second transistor 344 is attached to the second die supporting element 302B. The third transistor 346 is attached to the third die supporting element 302C. The fourth transistor 352, the fifth transistor 354 and the sixth transistor 356 are attached to the fourth die supporting element 302D. The first FRD 341 is attached to the first die supporting element 302A. The second FRD 343 is attached to the second die supporting element 302B. The third FRD 345 is attached to the third die supporting element 302C. The fourth FRD 351, the fifth FRD 353 and the sixth FRD 355 are attached to the fourth die supporting element 302D.

In examples of the present disclosure, the dummy bar 381 is electrically isolated from the connection bar 383. The connection bar 383 is electrically and mechanically connected to a connection pad 385. The dummy bar 381, the connection bar 383 and the connection pad 385 are electrically floating that they are isolated from the connection member 310 and the first die supporting element 302A, the second die supporting element 302B, the third die supporting element 302C, and the fourth die supporting element 302D. Therefore, the low voltage IC 320 and the high voltage IC 322 will not be damaged even a heat sink improperly contacts the end surface 391 of the dummy bar 381 or the end surface 393 of the connection bar 383.

In examples of the present disclosure, the molding encapsulation 398 encloses the first die supporting element 302A, the second die supporting element 302B, the third die supporting element 302C, the fourth die supporting element 302D, the first transistor 342, the second transistor 344, the third transistor 346, the fourth transistor 352, the fifth transistor 354, the sixth transistor 356, the first FRD 341, the second FRD 343, the third FRD 345, the fourth FRD 351, the fifth FRD 353, the sixth FRD 355, the connection member 310, the low voltage IC 320 and the high voltage IC 322. In examples of the present disclosure, the plurality of leads 380 and 382 are partially embedded in the molding encapsulation 398. In examples of the present disclosure, the molding encapsulation 398 encloses a majority portion of the dummy bar 381 and a majority portion of the connection bar 383.

In examples of the present disclosure, the first die supporting element 302A, the second die supporting element 302B, the third die supporting element 302C, and the fourth die supporting element 302D are metal (Cu) pads patterned on a direct bonded copper (DBC) type substrate 330. The DBC type substrate 330 comprises a bottom copper layer 333, a middle insulation layer 331 and a top copper layer 335. After an etching process, the top copper layer 335 of the DBC type substrate 330 comprises a first pad of the first die supporting element 302A, a second pad of the second die supporting element 302B, a third pad of the third die supporting element 302C and a fourth pad of the fourth die supporting element 302D.

In examples of the present disclosure, the DBC type substrate 330 in the embodiment shown is substantially rectangular in shape. The connection member 310 is adjacent and separate from a first long edge of the DBC type substrate 330. The plurality of leads 380 are disposed on a first side of the IPM 300 adjacent to the connection member 310 away from the DBC type substrate 330, the plurality of leads 382 disposed on a second side of the IPM 300 adjacent to the DBC type substrate 330, opposite the first side of the IPM 300. The connection member 310 and the pluralities of leads 380 and 382, as well as the dummy bar 381 and the connection bar 383, are made from regular lead frame material such as a single gauge or dual gauge copper and copper alloy, or other metal composition. As shown in FIG. 3A, the first die supporting element 302A is disposed at a first end of the DBC type substrate 330 and the fourth die supporting element 302D is disposed at a second end of the die supporting element 202 opposite the first end. The connection pad 385 is disposed on the first end of the DBC type substrate 330 at a first corner close to the connection bar 383, separating the first die supporting element 302A from the first long edge of the DBC type substrate 330. As shown, the first die supporting element 302A is electrically and mechanically connected to a first phase lead 382A of the plurality of leads 382 with the first phase lead 382A directly soldered to an edge portion of the first die supporting element 302A near a second long edge of the DBC type substrate 330 opposite the first long edge. The second die supporting element 302B is electrically and mechanically connected to a second phase lead 382B of the plurality of leads 382 with the second phase lead 382B directly soldered to an edge portion of the second die supporting element 302B near the second long edge of the DBC type substrate 330. The third die supporting element 302C is electrically and mechanically connected to a third phase lead 382C of the plurality of leads 382 with the third phase lead 382C directly soldered to an edge portion of the first die supporting element 302C near the second long edge of the DBC type substrate 330. The fourth die supporting element 302D is electrically and mechanically connected to an input lead 382D of the plurality of leads 382 with the input lead 382D directly soldered to an edge portion of the fourth die supporting element 302D near the second long edge of the DBC type substrate 330, approximating a second corner on the DBC type substrate 330 diagonally opposite the first corner. The mechanical connections between the connection bar 383 and the connection pad 385 at the first corner of the DBC type substrate 330, and between any of the leads 382A, 382B, 382C, 382D and the corresponding first die supporting element 302A, second die supporting element 302B, third die supporting element 302C, fourth die supporting element 302D at the second long edge of the DBC type substrate 240, anchor the position of the DBC type substrate 330 surrounded by the connection member 310 and the pluralities of leads 380 and 382, thus providing a lead frame.

In examples of the present disclosure, the first transistor 342 is a first metal-oxide-semiconductor field-effect transistor (MOSFET). The second transistor 344 is a second MOSFET. The third transistor 346 is a third MOSFET. The fourth transistor 352 is a fourth MOSFET. The fifth transistor 354 is a fifth MOSFET. The sixth transistor 356 is a sixth MOSFET.

In examples of the present disclosure, the first transistor 342 is a first insulated gate bipolar transistor (IGBT). The second transistor 344 is a second IGBT. The third transistor 346 is a third IGBT. The fourth transistor 352 is a fourth IGBT. The fifth transistor 354 is a fifth IGBT. The sixth transistor 356 is a sixth IGBT.

In examples of the present disclosure, the low voltage IC 320 is electrically connected to the first transistor 342, the second transistor 344 and the third transistor 346 by bonding wires 371. In examples of the present disclosure, the high voltage IC 322 is electrically connected to the fourth transistor 352, the fifth transistor 354 and the sixth transistor 356 by bonding wires 373.

In examples of the present disclosure, the molding encapsulation 398 has a first cutout 392 near the dummy bar 381 and a second cutout 394 near the connection bar 383. The first and second cutouts 392 and 394 are for screw mounts. In examples of the present disclosure, the first and second cutouts 392 and 394 are of half circular shapes.

Those of ordinary skill in the art may recognize that modifications of the embodiments disclosed herein are possible. For example, a radius of the first curved side 134 may vary. Other modifications may occur to those of ordinary skill in this art, and all such modifications are deemed to fall within the purview of the present invention, as defined by the claims.

The invention claimed is:

1. An intelligent power module (IPM) for driving a motor, the IPM comprising:
   a first, second, third and fourth die supporting elements;
   a first transistor attached to the first die supporting element;
   a second transistor attached to the second die supporting element;
   a third transistor attached to the third die supporting element;
   a fourth, fifth, and sixth transistors attached to the fourth die supporting element;
   a connection member;
   a low voltage integrated circuit (IC) attached to the connection member; the low voltage IC being electrically connected to the first, second and third transistors;
   a high voltage IC attached to the connection member, the high voltage IC being electrically connected to the fourth, fifth, and sixth transistors;
   a first plurality of leads;
   a second plurality of leads;
   a first dummy bar; and
   a molding encapsulation enclosing the first, second, third, and fourth die supporting elements, the first, second, third, fourth, fifth, and sixth transistors, the connection member, the low voltage IC, and the high voltage IC;
   wherein the first plurality of leads and the second plurality of leads are partially embedded in the molding encapsulation;
   wherein the first plurality of leads are extruded from a first side surface of the molding encapsulation;
   wherein the second plurality of leads are extruded from a second side surface of the molding encapsulation opposite the first side surface of the molding encapsulation;
   wherein a majority portion of the first dummy bar is embedded in the molding encapsulation;
   wherein the first dummy bar is electrically floating; and wherein an end surface of the first dummy bar is exposed from a first end surface of the molding encapsulation perpendicular to the first side surface of the molding encapsulation.

2. The IPM of claim 1 further comprising a first, second and third boost diodes; wherein the molding encapsulation encloses the first, second and third boost diodes.

3. The IPM of claim 2, wherein the plurality of leads comprises a first ground lead, a second ground lead and a single power supply lead;
wherein the connection member electrically and mechanically connects to the first ground lead and the second ground lead;
wherein the low voltage IC electrically connects to the single power supply lead by a first bonding wire; and
wherein the high voltage IC electrically connects to the single power supply lead by a second bonding wire.

4. The IPM of claim 2 further comprising a second dummy bar,
wherein the molding encapsulation encloses a majority portion of the second dummy bar;
wherein a second end surface of the second dummy bar is exposed from a second end surface of the molding encapsulation opposite the first end surface of the molding encapsulation;
wherein the first dummy bar is electrically isolated from the second dummy bar; and
wherein the first dummy bar and the second dummy bar are electrically isolated from the connection member and the first, second, third, and fourth die supporting elements.

5. The IPM of claim 4, wherein the first die supporting element is a first die attach pad (DAP);
wherein the second die supporting element is a second DAP;
wherein the third die supporting element is a third DAP; and
wherein the fourth die supporting element is a fourth DAP.

6. The IPM of claim 2 further comprising a connection bar,
wherein the molding encapsulation encloses a majority portion of the connection bar;
wherein an end surface of the connection bar is exposed from a second end surface of the molding encapsulation opposite the first end surface of the molding encapsulation;
wherein the dummy bar is electrically isolated from the connection bar; and
wherein the dummy bar is electrically isolated from the connection member and the first, second, third, and fourth die supporting elements; and
wherein the connection bar is electrically and mechanically connected to a connection pad.

7. The IPM of claim 6, wherein the first, second, third and fourth die supporting elements are metal pads patterned on a direct bonded copper (DBC) type substrate comprising a bottom copper layer, a middle insulation layer and a top copper layer; and
wherein the top copper layer of the DBC type substrate comprises the connection pad, a first pad of the first die supporting element, a second pad of the second die supporting element, a third pad of the third die supporting element and a fourth pad of the fourth die supporting element.

8. The IPM of claim 7, wherein the first die supporting element is electrically connected to a first phase lead by a first bonding wire;
wherein the second die supporting element is electrically connected to a second phase lead by a second bonding wire; and
wherein the third die supporting element is electrically connected to a third phase lead by a third bonding wire.

9. The IPM of claim 7, wherein the first die supporting element is electrically connected to a first phase lead;
wherein the first phase lead is directly soldered to an edge portion of the first die supporting element;
wherein the second die supporting element is electrically connected to a second phase lead;
wherein the second phase lead is directly soldered to an edge portion of the second die supporting element;
wherein the third die supporting element is electrically connected to a third phase lead; and
wherein the third phase lead is directly soldered to an edge portion of the third die supporting element.

10. The IPM of claim 2, wherein a first curved side of the third die supporting element and a second curved side of the fourth die supporting element have a same center of curvature and wherein a radius of curvature of the first curved side is larger than a radius of curvature of the second curved side.

11. An intelligent power module (IPM) for driving a motor, the IPM comprising:
a first, second, third and fourth die supporting elements;
a first transistor attached to the first die supporting element;
a second transistor attached to the second die supporting element;
a third transistor attached to the third die supporting element;
a fourth, fifth, and sixth transistors attached to the fourth die supporting element;
a plurality of leads; and
a molding encapsulation enclosing the first, second, third, and fourth die supporting elements, the first, second, third, fourth, fifth, and sixth transistors;
wherein the first, second, third and fourth die supporting elements are metal pads patterned on a direct bonded copper (DBC) type substrate comprising a bottom copper layer, a middle insulation layer and a top copper layer, wherein the plurality of leads are formed by a single gauge metal or a dual gauge metal.

12. The IPM of claim 11, further comprising:
a connection member;
a low voltage integrated circuit (IC) attached to the connection member; the low voltage IC being electrically connected to the first, second and third transistors;
a high voltage IC attached to the connection member, the high voltage IC being electrically connected to the fourth, fifth, and sixth transistors;
wherein the connection member, the low voltage IC, and the high voltage IC are embedded in the molding encapsulation.

13. The IPM of claim 12, wherein the DBC type substrate comprises a first edge and a second edge perpendicular to the first edge;
wherein the first edge is longer than the second edge;
wherein the connection member is disposed adjacent and separate from a first edge of the DBC type substrate;
wherein the connection member is formed by the single gauge metal or the dual gauge metal.

14. The IPM of claim 11, wherein the DBC type substrate further comprises a connection pad electrically connected to a connection bar.

15. The IPM of claim 14, wherein the first die supporting element is electrically connected to a first phase lead by a first bonding wire;
wherein the second die supporting element is electrically connected to a second phase lead by a second bonding wire; and
wherein the third die supporting element is electrically connected to a third phase lead by a third bonding wire.

16. The IPM of claim 15, wherein the connection bar being mechanically connected to the connection pad by a solder paste.

17. The IPM of claim 15, wherein the fourth die supporting element is electrically connected to an input lead; and
wherein the input lead is directly soldered onto an edge portion of the fourth die supporting element.

18. The IPM of claim 11, wherein the first die supporting element is electrically connected to a first phase lead;
wherein the first phase lead is directly soldered to an edge portion of the first die supporting element;
wherein the second die supporting element is electrically connected to a second phase lead;
wherein the second phase lead is directly soldered to an edge portion of the second die supporting element;
wherein the third die supporting element is electrically connected to a third phase lead; and
wherein the third phase lead is directly soldered to an edge portion of the third die supporting element.

19. The IPM of claim 11, further comprising a first fast recovery diode (FRD) attached to the first die supporting element;
a second FRD attached to the second die supporting element;
a third FRD attached to the third die supporting element; and
a fourth FRD, a fifth FRD, and a sixth FRD attached to the fourth die supporting element.

20. The IPM of claim 11, further comprising a first, second and third boost diodes; wherein the molding encapsulation encloses the first, second and third boost diodes.

\* \* \* \* \*